(12) United States Patent
Hou et al.

(10) Patent No.: US 12,336,389 B2
(45) Date of Patent: Jun. 17, 2025

(54) DISPLAY PANEL, MANUFACTURING METHOD THEREOF AND DISPLAY APPARATUS

(71) Applicant: BOE Technology Group Co., Ltd., Beijing (CN)

(72) Inventors: Wenjun Hou, Beijing (CN); Huaiting Shih, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 739 days.

(21) Appl. No.: 17/418,156

(22) PCT Filed: Dec. 29, 2020

(86) PCT No.: PCT/CN2020/141039
§ 371 (c)(1),
(2) Date: Jun. 24, 2021

(87) PCT Pub. No.: WO2021/174983
PCT Pub. Date: Sep. 10, 2021

(65) Prior Publication Data
US 2023/0133156 A1 May 4, 2023

(30) Foreign Application Priority Data

Mar. 2, 2020 (CN) .......................... 202010134649.8

(51) Int. Cl.
*H10K 59/122* (2023.01)
*H10K 59/12* (2023.01)
(Continued)

(52) U.S. Cl.
CPC ....... *H10K 59/122* (2023.02); *H10K 59/1201* (2023.02); *H10K 59/353* (2023.02); *H10K 71/135* (2023.02)

(58) Field of Classification Search
CPC ............. H10K 59/122; H10K 59/1201; H10K 59/353; H10K 71/135; H10K 59/35
See application file for complete search history.

(56) References Cited

U.S. PATENT DOCUMENTS

| | | | |
|---|---|---|---|
| 2010/0141875 A1 | 6/2010 | Shim et al. | |
| 2010/0181554 A1* | 7/2010 | Yoshida | H10K 50/813 257/40 |

(Continued)

FOREIGN PATENT DOCUMENTS

| | | |
|---|---|---|
| CN | 103311269 A | 9/2013 |
| CN | 104465671 A | 3/2015 |

(Continued)

OTHER PUBLICATIONS

CN202010134649.8 first office action, dated Mar. 2021.
CN202010134649.8 second office action, dated Jul. 2021.

*Primary Examiner* — Ratisha Mehta
*Assistant Examiner* — Brad A Knudson
(74) *Attorney, Agent, or Firm* — IPro, PLLC

(57) ABSTRACT

A display panel, a manufacturing method thereof and a display apparatus are provided. The display panel includes: a base substrate (10); a plurality of pixel units (P) are arranged on the base substrate (10); a pixel defining layer (11), located on the base substrate (10); the pixel defining layer (11) includes: a plurality of openings (U) located in all the pixel units (P) respectively, and a plurality of communicating grooves (T); and the openings corresponding to the two pixel units with the same color are connected through the communicating grooves (T).

12 Claims, 10 Drawing Sheets

(51) Int. Cl.
*H10K 59/35* (2023.01)
*H10K 71/13* (2023.01)

(56) References Cited

U.S. PATENT DOCUMENTS

| | | | |
|---|---|---|---|
| 2016/0043150 A1 | 2/2016 | Wang et al. | |
| 2016/0351632 A1* | 12/2016 | Iguchi | H10K 71/135 |
| 2016/0358987 A1* | 12/2016 | Hou | H10K 71/00 |
| 2016/0359112 A1* | 12/2016 | Wang | H10K 59/122 |
| 2017/0287993 A1* | 10/2017 | Takata | H10K 71/191 |
| 2020/0075687 A1 | 3/2020 | He et al. | |

FOREIGN PATENT DOCUMENTS

| | | | | |
|---|---|---|---|---|
| CN | 105206643 A | | 12/2015 | |
| CN | 205542786 U | * | 8/2016 | ........... H10K 59/122 |
| CN | 106597802 A | | 4/2017 | |
| CN | 109148543 A | | 1/2019 | |
| CN | 111312791 A | | 6/2020 | |
| JP | 2007115529 A | | 5/2007 | |

\* cited by examiner

DISPLAY PANEL, MANUFACTURING METHOD THEREOF AND DISPLAY APPARATUS

CROSS-REFERENCE TO RELATED APPLICATIONS

This application is a National Stage of International Application No. PCT/CN2020/141039, filed Dec. 29, 2020, which claims priority to Chinese Patent Application No. 202010134649.8, filed Mar. 2, 2020, both of which are hereby incorporated by reference in their entireties.

FIELD

The present disclosure relates to the field of display, in particular to a display panel, a manufacturing method thereof and a display apparatus.

BACKGROUND

Compared with a liquid crystal display (LCD), an organic light-emitting diode (OLED) has the advantages of self-illumination, quick response, wide viewing angle, high brightness, beautiful color, light weight and thinness and so on, and is regarded as the next generation of a display technology.

A thin film deposition method of the OLED mainly includes vacuum evaporation and solution process. The solution process includes spin coating, ink-jet printing, a nozzle coating method and the like, is suitable for polymer materials and soluable micromolecules, has the characteristic of low device cost, and has the outstanding advantage in large-scale and large-size production.

By adopting an ink-jet printing technique, a solution can be subjected to ink jet accurately to a pixel limiting region to form an organic thin film. However, the pixel limiting region is small in size, a volatilization rate of a solvent has difference due to a length-width ratio in the pixel limiting region, consequently, the formed organic thin film is poor in thickness uniformity, and the light emitting quality of the OLED is affected.

SUMMARY

A display panel provided by an embodiment of the present disclosure, includes:
a base substrate, wherein a plurality of pixel units are arranged on the base substrate in an array; and
a pixel defining layer, located on the base substrate, wherein the pixel defining layer includes: a plurality of openings and at least one communicating groove, and the plurality of openings are located in the pixel units respectively; and
the communicating groove is configured to connect the openings corresponding to two pixel units with same color.

Optionally, in some embodiments of the present disclosure, the openings are rectangular and include first edges extending in a first direction and second edges extending in a second direction, and a length of the first edges is larger than that of the second edges; and the communicating groove connects the two first edges close to each other in two adjacent openings.

Optionally, in some embodiments of the present disclosure, the plurality of pixel units are arranged in the first direction and the second direction in the array; and two adjacent pixel units in the first direction display different colors, and two adjacent pixel units in the second direction display different colors.

Optionally, in some embodiments of the present disclosure, two adjacent pixel units in a third direction display same color; and
the third direction is different from the first direction and the second direction.

Optionally, in some embodiments of the present disclosure, a width of the communicating groove in the first direction is consistent with the length of the first edges.

Optionally, in some embodiments of the present disclosure, the display panel further includes: an organic light-emitting function layer located in the openings; wherein
a surface of the organic light-emitting function layer facing away from the base substrate serves as a first surface, and a surface of the pixel defining layer close to the base substrate serves as a second surface; and
a distance between the first surface and the second surface is smaller than a distance between a bottom surface of the communicating groove and the second surface.

Optionally, in some embodiments of the present disclosure, the pixel defining layer includes: a first pixel defining structure located on one side of the bottom surface of the communicating groove close to the base substrate, and a second pixel defining structure except for the first pixel defining structure; and
the second pixel defining structure is of an integrated structure.

Optionally, in some embodiments of the present disclosure, the first pixel defining structure is composed of lyophilic materials; and
the second pixel defining structure is composed of lyophobic materials.

Optionally, in some embodiments of the present disclosure, materials of the first pixel defining structure include silicon dioxide, silicon nitride, silicon oxynitride, polymethyl methacrylate or polyimide; and
materials of the second pixel defining structure include fluorinated polymethyl methacrylate or fluorinated polyimide.

Optionally, in some embodiments of the present disclosure, the pixel defining layer is of an integrated structure;
the bottom surface of the communicating groove has a lyophilic property; and
a surface except for all the communicating groove, of the pixel defining layer facing away from the base substrate, has a lyophobic property.

Optionally, in some embodiments of the present disclosure, a thickness of the pixel defining layer at a position except for the openings and the communicating grooves is within a range of 0.5 μm-3 μm.

Optionally, in some embodiments of the present disclosure, a distance between the bottom surface of the communicating groove and the surface of the pixel defining layer close to the base substrate is within a range of 0.1 μm-1 μm.

Accordingly, an embodiment of the present disclosure further provides a method for manufacturing the above display panel, including:
forming the pixel defining layer on the base substrate and patterning the pixel defining layer to form a plurality of openings and a plurality of communicating grooves; and
forming an organic light-emitting function layer through an ink-jet printing technique.

Optionally, in some embodiments of the present disclosure, the forming the pixel defining layer on the base substrate and patterning the pixel defining layer to form the plurality of openings and the plurality of communicating grooves, includes:

forming a first pixel defining layer on the base substrate through a lyophilic material and patterning the first pixel defining layer to obtain a plurality of first pixel defining structures;

forming a second pixel defining layer on the first pixel defining layer through a lyophobic material and patterning the second pixel defining layer to obtain a second pixel defining structure; or forming the second pixel defining layer on the base substrate through a lyophobic material and patterning the second pixel defining layer to obtain the second pixel defining structure; and forming the first pixel defining layer on the second pixel defining layer through the lyophilic material and patterning the first pixel defining layer to obtain the plurality of first pixel defining structures.

Optionally, in some embodiments of the present disclosure, the forming the pixel defining layer on the base substrate and patterning the pixel defining layer to form the plurality of openings and the plurality of communicating grooves, includes:

forming the pixel defining layer on the base substrate through the lyophobic material; and patterning the pixel defining layer through a half-tone mask plate to obtain the openings and the communicating grooves with lyophilic bottom surfaces.

Accordingly, an embodiment of the present disclosure further provides a display apparatus, including the above display panel.

DETAILED DESCRIPTION OF THE EMBODIMENTS

Figure 1:
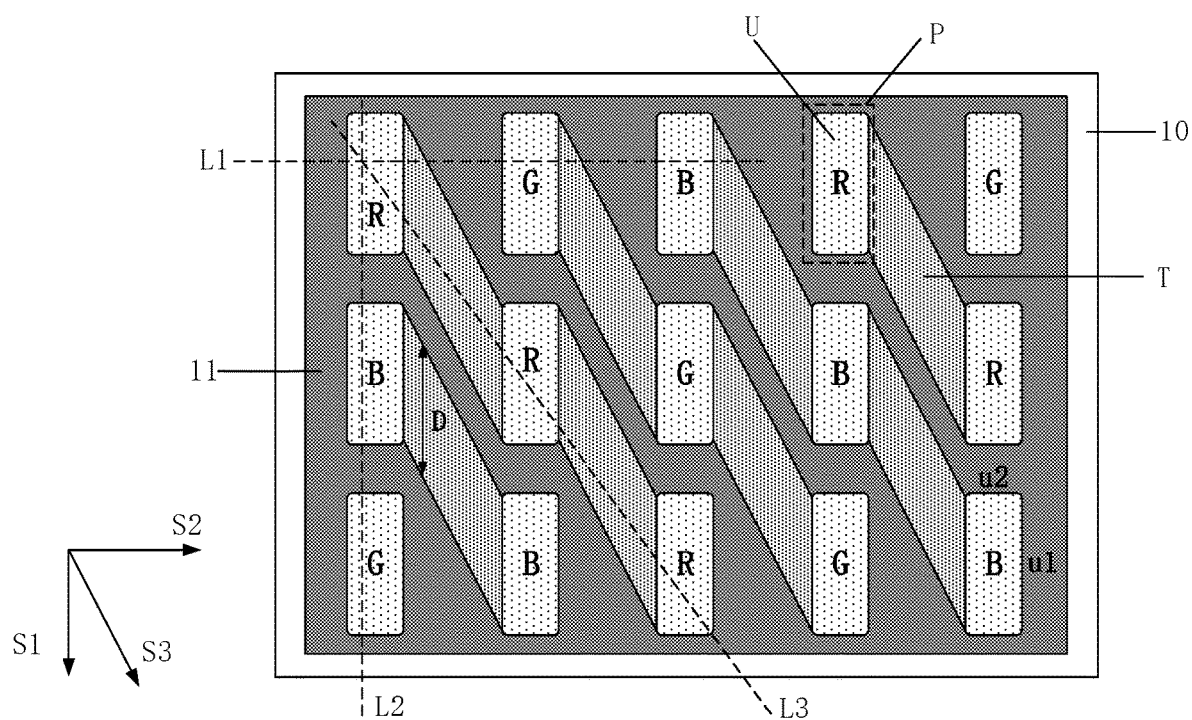
FIG. 1 is a schematic diagram of a plane structure of a display panel provided by an embodiment of the present disclosure.

Aiming at solving the problem that an organic thin film formed by adopting an ink-jet printing technique is poor in thickness uniformity, some embodiments of the present disclosure provide a display panel, a manufacturing method thereof and a display apparatus.

The implementations of the display panel, the manufacturing method thereof and the display apparatus provided by embodiments of the present disclosure are illustrated in detail below with reference to the drawings. The thicknesses and shapes of all film layers in the drawings do not reflect a true scale and are only intended to illustrate the contents of the present disclosure.

Figure 2:
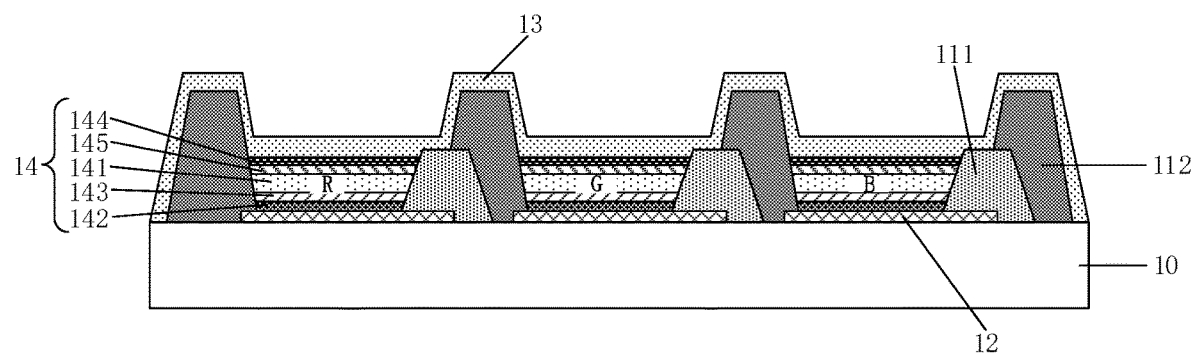
FIG. 2 is a schematic sectional diagram of FIG. 1 at a dotted line L1.
Figure 3:
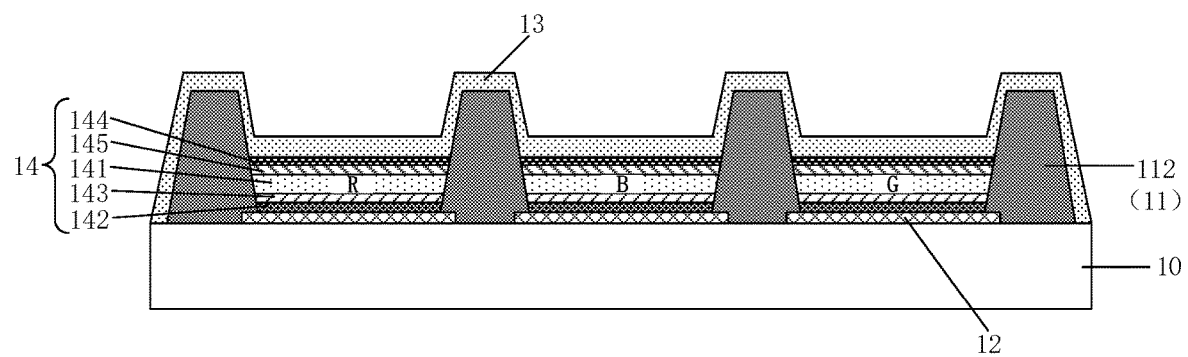
FIG. 3 is a schematic sectional diagram of FIG. 1 at a dotted line L2.
Figure 4:
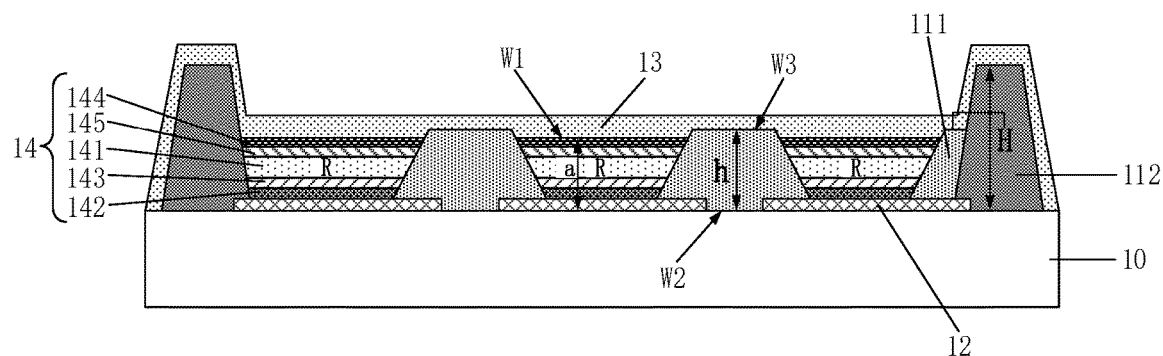
FIG. 4 is a schematic sectional diagram of FIG. 1 at a dotted line L3.

An embodiment of the present disclosure provides a display panel. FIG. 1 is a schematic diagram of one plane structure of the display panel provided by the embodiment of the present disclosure. FIG. 2 is a schematic sectional diagram of FIG. 1 at a dotted line L1. FIG. 3 is a schematic sectional diagram of FIG. 1 at a dotted line L2. FIG. 4 is a schematic sectional diagram of FIG. 1 at a dotted line L3. As shown in FIG. 1 to FIG. 4, the display panel includes:

a base substrate 10, wherein a plurality of pixel units P are arranged on the base substrate 10 in an array; and a pixel defining layer 11, located on the base substrate 10, wherein the pixel defining layer 11 includes: a plurality of openings U and at least one communicating groove T, and the plurality of openings U are located in all the pixel units P respectively; and the openings U corresponding to the two pixel units P with the same color are connected through the communicating grooves T.

According to the above display panel provided by embodiments of the present disclosure, the communicating grooves are formed in the pixel defining layer to enable the openings corresponding to the two pixel units with the same color to communicate with each other, thus flowability of ink droplets is enhanced so as to improve thickness uniformity of an organic thin film formed by an ink-jet printing technique, thereby improving light emitting quality of an organic light-emitting diode.

The display panel provided by some embodiments of the present disclosure may be an organic light-emitting display panel. During implementation, as shown in FIG. 1 and FIG.

2, the above display panel may further include: a plurality of first electrodes 12, a second electrode 13 and organic light-emitting function layers 14 located between the first electrodes 12 and the second electrode 13. The above first electrodes 12 are anodes, and the second electrode 13 is a cathode; or the above first electrodes 12 are cathodes, and the above second electrode 13 is an anode, which is not limited here.

The above pixel defining layer includes the plurality of openings U. The openings U are configured to limit opening regions of the pixel units P, and the plurality of openings U are in one-to-one correspondence with all the first electrodes 12 respectively. The corresponding first electrodes 12 are exposed through all the openings U, and thus the organic light-emitting function layers 14 may make contact with the first electrodes 12 so as to enable the first electrodes 12 to provide carriers to the organic light-emitting function layers 14. In addition, a driving circuit may further be included between the first electrodes 12 and the base substrate 10. The driving circuit is electrically connected with all the first electrodes 12 to provide driving signals to all the first electrodes 12 so as to realize image display.

Optionally, the organic light-emitting function layers 14 may include film layers such as a light emitting layer 141, a hole injection layer 142, a hole transporting layer 143, an electron injection layer 144 and an electron transporting layer 155.

In an actual technique process, the organic light-emitting function layers 14 of the pixel units P with the same color may be made of the same materials. Therefore, the openings U corresponding to the two pixel units P with the same color are connected through the communicating grooves T. When the organic light-emitting function layers 14 are manufactured through the ink-jet printing technique, ink droplets may flow in the communicating grooves T and the openings U connected through the communicating grooves T, and a flow range of the ink droplets is enlarged, thereby enhancing flowability of the ink droplets and improving uniformity of the formed organic light-emitting function layers 14. In a drying technique process of the ink-jet printing technique, a thin film with good uniformity is easier to obtain through drying, thereby also reducing requirements for an air pumping rate in a drying technique. In addition, aligning precision of an ink-jet printing device can also be reduced, thereby reducing the device cost.

During implementation, the two adjacent openings U may be connected through the above communicating grooves T. The communicating grooves T are prevented from being bent in order to avoid the other pixel units P, and it is ensured that the ink droplets have the good flowability in the communicating grooves T.

Optionally, in the above display panel provided by embodiments of the present disclosure, as shown in FIG. 1 to FIG. 4, the openings U are rectangular and include first edges u1 extending in a first direction S1 and second edges u2 extending in a second direction S2, and a length of the first edges u1 is larger than that of the second edges u2; and the communicating grooves T are connected with the two first edges u1 close to each other in the two adjacent openings U.

Because the first edges u1 and the second edges u2 of the openings U are different in length, the ink droplets are printed in the openings U, the first direction S1 and the second direction S2 are different in volatilization rate, volatilization rate in the second direction S2 is larger, and film-forming uniformity in the second direction S2 is poorer. In the embodiment of the present disclosure, the communicating grooves T are connected with the two first edges u1 close to each other in the two adjacent openings U, thereby enlarging the flowing range of the ink droplets in the second direction S2 and improving the film-forming uniformity of the second direction S2.

In some embodiments of the present disclosure, the above openings U are rectangular, which may be a standard rectangle or a corner-cut rectangle, which is not limited here.

During implementation, in the above display panel provided by embodiments of the present disclosure, as shown in FIG. 1, the plurality of pixel units P are arranged in the first direction S1 and the second direction S2 in the array; and the two adjacent pixel units P in the first direction S1 display different colors, and the two adjacent pixel units P in the second direction S2 display different colors.

Referring to FIG. 1, the two adjacent pixel units P display the different colors in the first direction S1 and the second direction S2, and therefore, the two openings U connected through the communicating grooves T are located on different rows and different columns. Optionally, the pixel units P displaying the different colors may be arrayed alternately in the first direction S1 (or the second direction S2) in a specified order. Taking the pixel units P divided into the three colors of red (R), green (G) and blue (B) as an example, the pixel units P may be arrayed alternately in the first direction S1 in an order of RBG and may be arrayed alternately in the second direction S2 in an order of RGB. In addition, other arraying modes can also be adopted, which is not limited here.

Further, in the above display panel provided by embodiments of the present disclosure, referring to FIG. 1 as well, the two adjacent pixel units P in a third direction S3 show the same color; and the third direction S3 is different from the first direction S1 and the second direction S2.

As shown in FIG. 1, the third direction S3 may be a diagonal direction of arraying of the pixel units P. The two openings U connected through the communicating grooves T may correspond to the two adjacent pixel units P in the third direction S3. Therefore, by forming the communicating grooves T, the flowing range of the ink droplets in the second direction S2 can be enlarged, and film-forming uniformity of the second direction S2 can be improved.

During implementation, as shown in FIG. 1, the plurality of communicating grooves T may be formed to enable the openings U corresponding to the plurality of pixel units P arrayed in the third direction S3 to communicate with each other, thereby further enlarging the flowing range of the ink droplets. In the ink-jet printing technique process, the ink droplets can flow in a channel constituted by the plurality of openings U and the plurality of communicating grooves T until the thickness of the ink droplets is roughly uniform, thereby improving the film-forming uniformity of the organic light-emitting function layers and reducing control precision of volume difference of nozzle pieces. In actual application, the number of the openings U communicating with each other in the row of pixel units P in the third direction S3 can be set according to actual conditions, which is not limited here.

In addition, the plurality of communicating grooves T may be formed to enable the openings U corresponding to the plurality of pixel units P in the third direction S3 to communicate with each other, thereby further reducing the requirements for the ink-jet printing device. In the ink-jet printing technique process, the ink droplets can flow to the other opening U only by dripping the ink droplets to one of the openings U or communicating grooves T, thereby reducing the precision of the ink-jet printing device. Furthermore, when spray heads of the ink-jet printing device are blocked, the influence generated by spray head blocking on all the pixel units P is reduced because the plurality of openings U communicate with each other and the ink droplets are uniformly distributed in all the openings U. Therefore, when a finite number of spray heads is blocked in the ink-jet printing device, the influence on the overall effect of the ink-jet printing technique is small, thereby enlarging a technique window of the ink-jet printing technique.

In the organic light-emitting display panel, the service life of blue pixel units is generally shorter compared with red pixel units or green pixel units. In order to avoid the situation that the brightness of the blue pixel units is reduced due to attenuation and consequently the display effect of the display panel is affected, a size of the blue pixel units is generally greater than that of the red pixel units and the green pixel units, and the size of the red pixel units is smaller than that of the green pixel units. Therefore, in the embodiment of the present disclosure, all the red pixel units can communicate with each other through the communicating grooves, or the red pixel units and the red pixel units communicate with each other through the communicating grooves respectively, which can be set according to actual needs and is not limited here.

In actual application, in the above display panel provided by embodiments of the present disclosure, as shown in FIG. 1, a width D of the communicating grooves T in the first direction S1 is consistent with the length of the first edges u1. Therefore, edges of the communicating grooves T may be aligned with the first edges u1 of the openings U, thereby further improving the flowability of the ink droplets in the second direction S2.

Optionally, in the above display panel provided by embodiments of the present disclosure, as shown in FIG. 1 and FIG. 4, may further include: the organic light-emitting function layers 14 located in the openings U;

a surface of one side of each organic light-emitting function layer 14 facing away from the base substrate 10 serves as a first surface W1, and a surface of one side of the pixel defining layer 11 close to the base substrate 10 serves as a second surface W2; and a distance a between the first surfaces W1 and the second surface W2 is smaller than a distance h between bottom surfaces W3 of the communicating grooves T and the second surface, wherein the bottom surfaces W3 of the communicating grooves T are bottoms of inner walls of the communicating grooves T.

That is to say, the organic light-emitting function layers 14 are only located in the corresponding openings U to prevent the carriers in the light-emitting function layers 14 from flowing into the other adjacent pixel units P and prevent mutual influence between the adjacent pixel units P, thereby improving the display effect of the display panel. In addition, it should be noted that in a manufacturing technique process, the ink droplets dripped into the openings U through the ink-jet printing technique are liquid, and the ink droplets can flow in the communicating grooves T and the openings U connected through the communicating grooves T. A solvent in the ink droplets is volatilized after a subsequent drying technique, and therefore, the formed organic light-emitting function layers 14 are left in the openings U.

During implementation, in the above display panel provided by embodiments of the present disclosure, as shown in FIG. 1 to FIG. 4, the above pixel defining layer 11 may include: first pixel defining structures 111 located on one sides of the bottom surfaces of the communicating grooves T close to the base substrate 10, and second pixel defining structures 112 except for all the first pixel defining structures 111; and the second pixel defining structures 112 are of an integrated structure.

Because the first pixel defining structures 111 and the second pixel defining structures 112 are different in thickness, the pixel defining layer 11 is arranged to include the first pixel defining structures 111 and the second pixel defining structures 112, and a composition technique can be adopted twice to manufacture the first pixel defining structures 111 and the second pixel defining structures 112 respectively. The composition technique has the low requirements for a mask plate and is simple.

Further, in the above display panel provided by embodiments of the present disclosure, referring to FIG. 1 to FIG. 4, the above first pixel defining structures 111 are composed of lyophilic materials; and the above second pixel defining structures 112 are composed of lyophobic materials.

By adopting the lyophilic materials to manufacture the first pixel defining structures 111, the ink droplets can flow in the communicating grooves T. By adopting the lyophobic materials to manufacture the second pixel defining structures 112, the ink droplets can be prevented from flowing to a position other than the openings U and the communicating grooves T.

Optionally, in the above display panel provided by embodiments of the present disclosure, the materials of the above first pixel defining structures include silicon dioxide, silicon nitride, silicon oxynitride, polymethyl methacrylate or polyimide; and the materials of the second pixel defining structures include fluorinated polymethyl methacrylate or fluorinated polyimide.

During implementation, photoresist (e.g. positive photoresist) materials may be adopted to manufacture the above first pixel defining structures, therefore, the above first pixel defining structures can be obtained through a photolithography technique, and a manufacturing technique is simple, for example, the polymethyl methacrylate or polyimide materials may be adopted. Similarly, photoresist can also be adopted to manufacture the second pixel defining structures, for example, the fluorinated polymethyl methacrylate or fluorinated polyimide may be adopted. Or other materials can also be adopted to manufacture the above first pixel defining structures and the second pixel defining structures, and the materials of the first pixel defining structures and the materials of the second pixel defining structures are not limited here.

When inorganic materials such as silicon dioxide, silicon nitride and silicon oxynitride are adopted to manufacture the above first pixel defining structures, a dry etching technique can be adopted to obtain patterns of the first pixel defining structures.

In actual application, the above first pixel defining structures may also be composed of a plurality of stacked sub film layers, and all the sub film layers may be made of the same materials or the different materials. Similarly, the above second pixel defining structures may also be composed of a plurality of stacked sub film layers, and all the sub film layers may be made of the same materials or the different materials.

Figure 5:
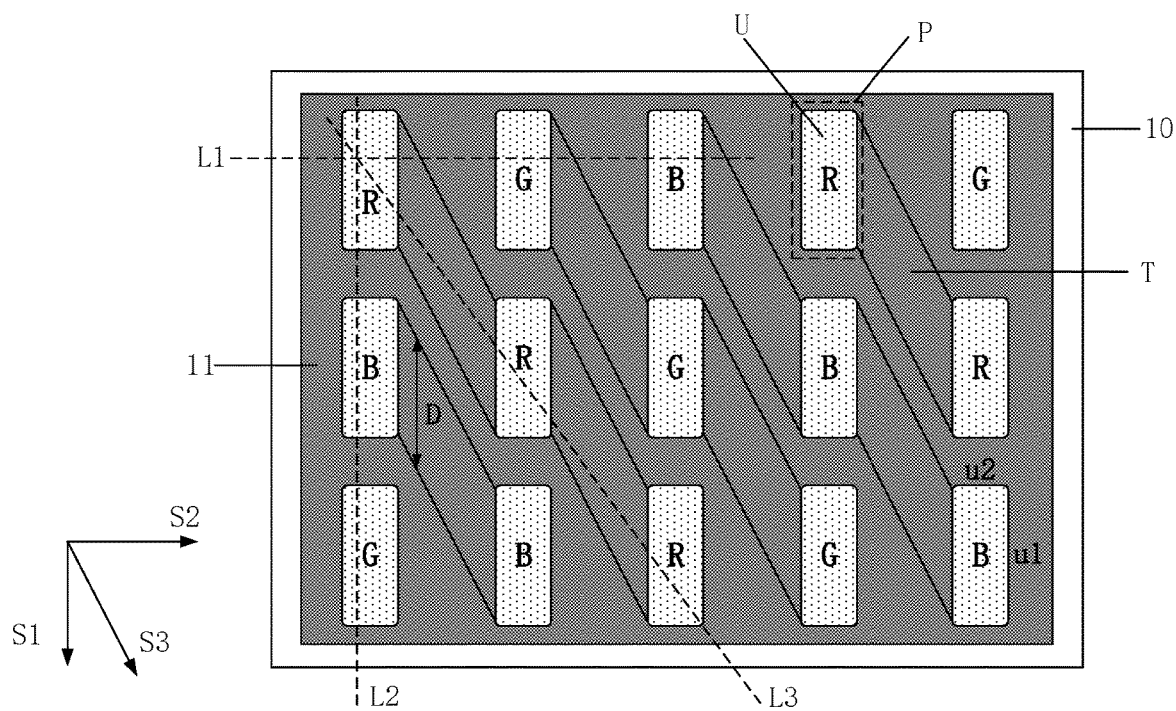
FIG. 5 is a schematic diagram of another plane structure of a display panel provided by an embodiment of the present disclosure.

During implementation, in the above display panel provided by embodiments of the present disclosure, FIG. 5 is a schematic diagram of another plane structure of the display panel provided by the embodiment of the present disclosure.

Figure 6:
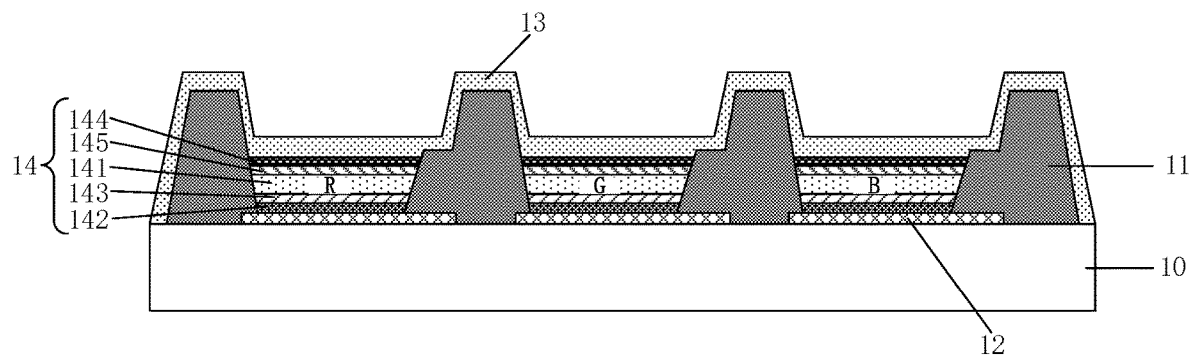
FIG. 6 is a schematic sectional diagram of FIG. 5 at a dotted line L1.
Figure 7:
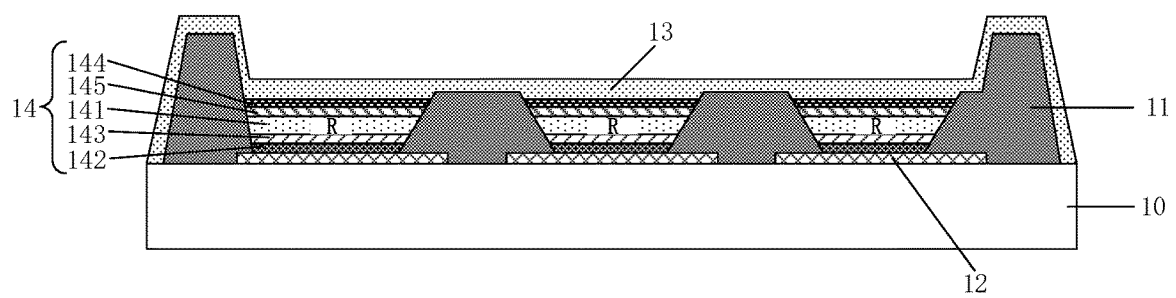
FIG. 7 is a schematic sectional diagram of FIG. 5 at a dotted line L3.

A section of the schematic diagram of the plane structure shown in FIG. 5 at a dotted line L1 may be as shown in FIG. 6, a section at a dotted line L2 may be as shown in FIG. 3, and a section at a dotted line L3 may be as shown in FIG. 7. As shown in FIG. 3 and FIG. 5 to FIG. 7, the pixel defining layer 11 may be of an integrated structure;

the bottom surfaces of the communicating grooves T have a lyophilic property; and in a surface of one side of the pixel defining layer 11 facing away from the base substrate 10, the surfaces except for all the communicating grooves T have a lyophobic property.

The bottom surfaces of the above communicating grooves T have the lyophilic property so that the ink droplets can flow in the communicating grooves T. Furthermore, in the surface of one side of the pixel defining layer 11 facing away from the base substrate 10, the surfaces except for the communicating grooves T have the lyophobic property so that the ink droplets can be prevented from flowing to the position other than the openings U and the communicating grooves T.

In the actual technique process, the above pixel defining layer 11 may be manufactured by adopting the lyophobic materials through a one-time composition technique. For example, the positive photoresist materials such as the fluorinated polymethyl methacrylate or fluorinated polyimide may be adopted, and therefore, the patterns of the pixel defining layer 11 can be obtained only by adopting the photolithography technique. The composition technique is less in the number of times, and a manufacturing cost is saved. Furthermore, the lyophobic materials are generally blended, taking the fluorinated polyimide as an example, lyophobic fluorides and lyophilic polyimide in the fluorinated polyimide are physically blended. After the fluorinated polyimide is coated on the base substrate, the fluorides have low surface energy, therefore, in technique processes such as solvent removing and exposure, the fluorides will migrate upwards to be aggregated on the surfaces of film layers. Therefore, after the photolithography technique is completed, the fluorides aggregated on the surfaces are removed at the positions of the communicating grooves, and the bottom surfaces of the communicating grooves T are the polyimide materials. That is to say, the performance of the bottom surfaces of the communicating grooves T is changed after the composition technique, and the bottom surfaces of the communicating grooves T are made to have the lyophilic property.

In actual application, in the above display panel provided by the embodiment of the present disclosure, as shown in FIG. 1 and FIG. 4, a thickness H of the pixel defining layer 11 at a position except for all the openings U and all the communicating grooves T is within a range of 0.5 μm-3 μm. The thickness H of the pixel defining layer 11 is set to be within the range of 0.5 μm-3 μm, thus it can be ensured that the ink droplets do not flow to the position other than the openings U and the communicating grooves T in the ink-jet printing technique process, and the ink droplets are prevented from overflowing to influence the performance of the display panel.

Optionally, in the above display panel provided by embodiments of the present disclosure, referring to FIG. 1 and FIG. 4 as well, a distance h between the bottom surfaces of the communicating grooves T and the surface of one side of the pixel defining layer 11 close to the base substrate 10 is within a range of 0.1 μm-1 μm. In this way, in the ink-jet printing technique process the ink droplets can flow in the communicating grooves T and the openings U. After a drying technique, the formed organic light-emitting function layers 14 are only located in the openings U, and mutual influence between the adjacent pixel units P is avoided, thereby improving the display effect of the display panel. During implementation, the above distance h may also be set to be within the range of 0.5 μm-1 μm, or the distance h may also be set to be other sizes according to the actual condition, which is not limited here.

In addition, the communicating grooves T do not penetrate through the pixel defining layer 11 so as to play a role in covering the first electrodes 12 on the lower layer and signal lines, an electric leakage phenomenon is prevented, and influencing on the display performance is prevented.

Based on the same inventive concept, an embodiment of the present disclosure further provides a manufacturing method of the above display panel. Principles of the manufacturing method for solving the problems are similar to those of the display panel, therefore, implementation of the manufacturing method may refer to that of the display panel, which is not repeated here.

Figure 8:
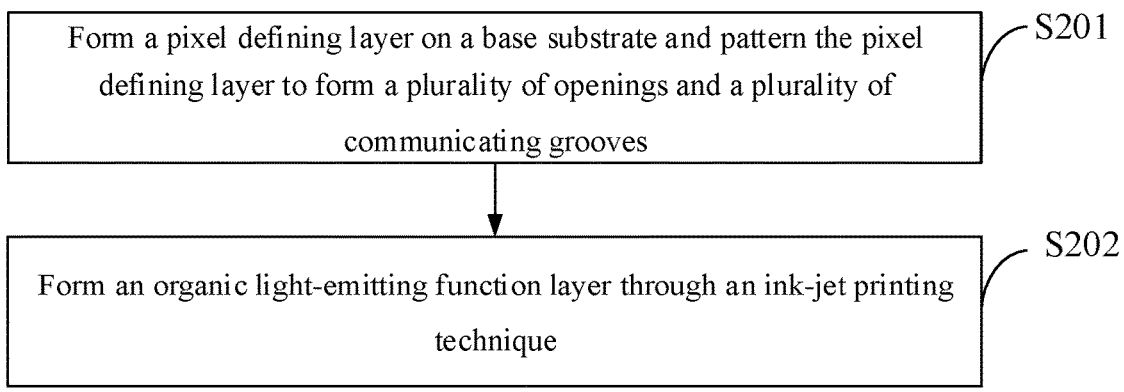
FIG. 8 is a flow diagram of a manufacturing method of a display panel provided by an embodiment of the present disclosure.

The manufacturing method of the display panel provided by embodiments of the present disclosure, as shown in FIG. 8, includes:

S201, a pixel defining layer is formed on a base substrate and the pixel defining layer is patterned to form a plurality of openings and a plurality of communicating grooves; and S202, an organic light-emitting function layer is formed through an ink-jet printing technique.

In the manufacturing method provided by embodiments of the present disclosure, the pixel defining layer is patterned to form the plurality of openings and the plurality of communicating grooves, and the openings corresponding to the two pixel units with the same color can be connected through the communicating grooves. When the organic light-emitting function layer is manufactured through the ink-jet printing technique, ink droplets can flow in the communicating grooves and the openings, flowability of the ink droplets is enhanced, thickness uniformity of an organic thin film formed by the ink-jet printing technique is improved, thereby improving the light emitting quality of an organic light-emitting diode.

In actual application, before above step S201, the manufacturing method may further include: all film layers of a driving circuit are formed on the base substrate and all first electrodes are formed.

Figure 9:
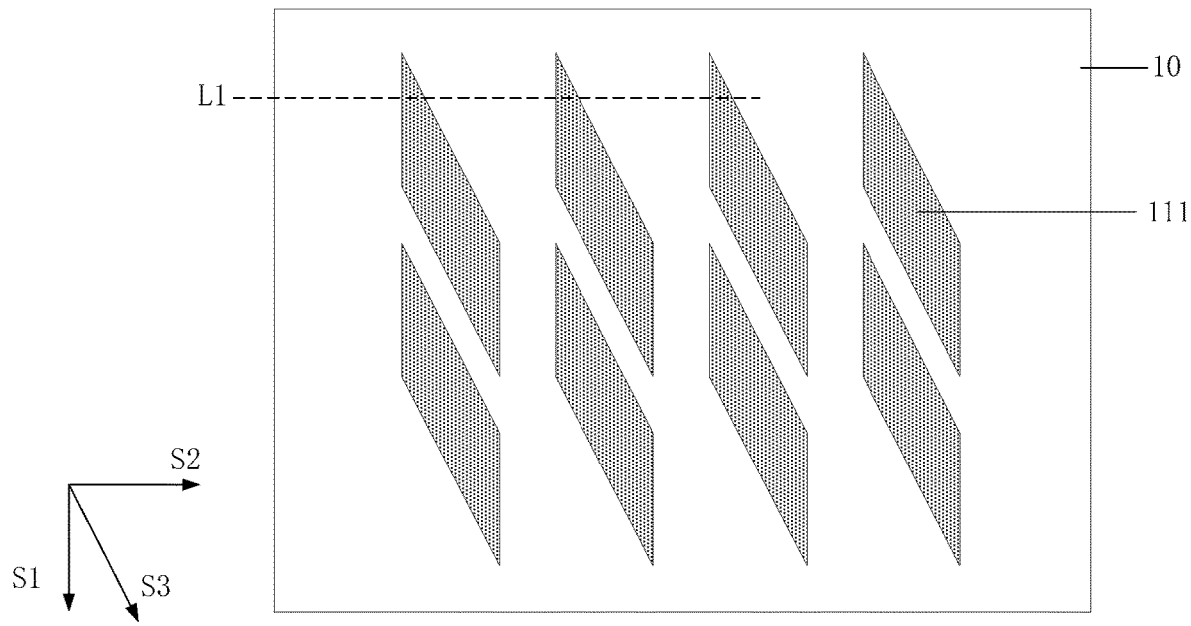
FIG. 9 is a schematic structural diagram corresponding to a step in a manufacturing method provided by an embodiment of the present disclosure.
Figure 10:
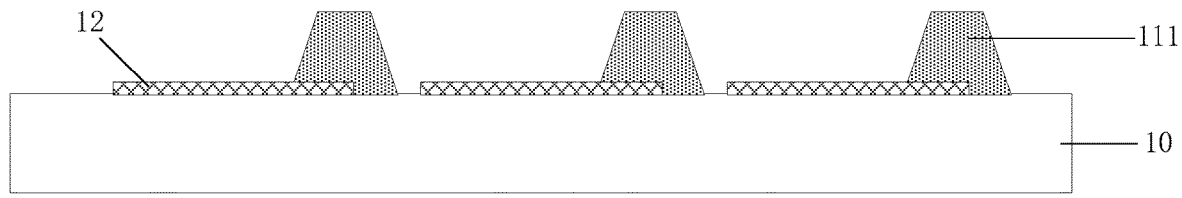
FIG. 10 is a schematic structural diagram corresponding to another step in the manufacturing method provided by an embodiment of the present disclosure.
Figure 11:
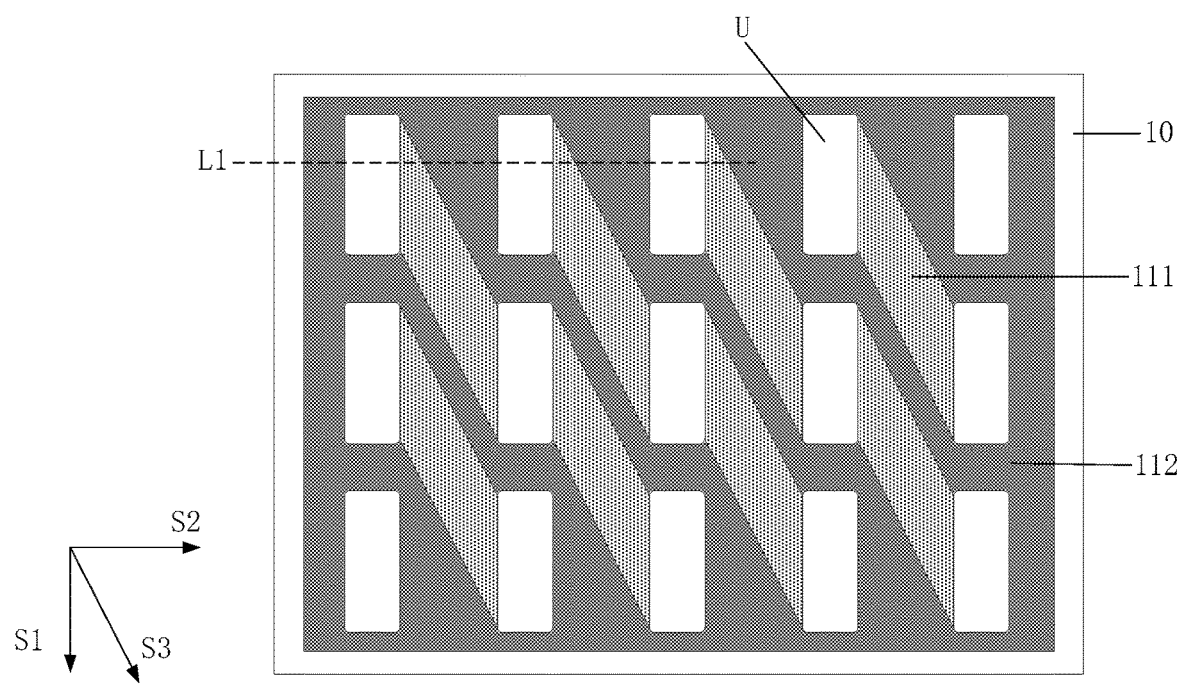
FIG. 11 is a schematic structural diagram corresponding to another step in the manufacturing method provided by an embodiment of the present disclosure.
Figure 12:
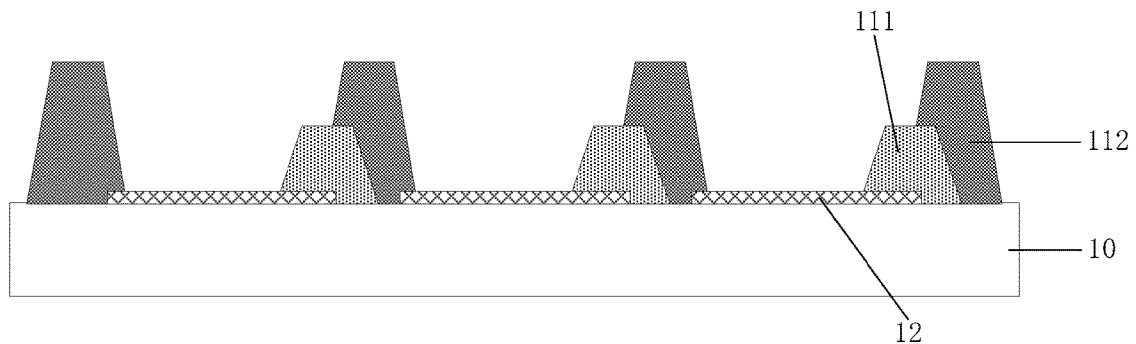
FIG. 12 is a schematic structural diagram corresponding to another step in the manufacturing method provided by an embodiment of the present disclosure.

Optionally, in the above manufacturing method provided by embodiments of the present disclosure, taking structures as shown in FIG. 1 and FIG. 2 as an example, the above step S201 may include:

FIG. 10 is a schematic sectional diagram of FIG. 9 at a dotted line L1. As shown in FIG. 9 and FIG. 10, a first pixel defining layer is formed on the base substrate 10 through a lyophilic material and the first pixel defining layer is patterned to obtain a plurality of first pixel defining structures 111; and FIG. 12 is a schematic sectional diagram of FIG. 11 at a dotted line L1. As shown in FIG. 11 and FIG. 12, a second pixel defining layer is formed on the first pixel defining layer through a lyophobic material and the second pixel defining layer is patterned to obtain a second pixel defining structures 112.

Because the first pixel defining structures 111 and the second pixel defining structures 112 are different in thickness, the first pixel defining structures 111 and the second pixel defining structures 112 are manufactured respectively through two times of composition process. The composition process has low requirements for the mask plate and is simple. Furthermore, the above first pixel defining structures 111 may be manufactured by adopting the lyophilic photoresist material, and the above second pixel defining structures 112 may be manufactured by adopting the lyophobic photoresist material. The patterns of the first pixel defining structures and the second pixel defining structures can be obtained only through the photolithography technique, the manufacturing process is simple, and the process cost is further reduced.

Figure 13:
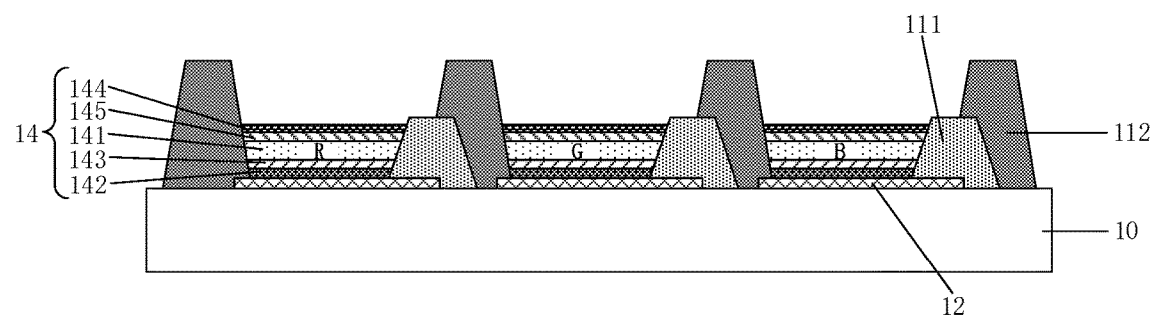
FIG. 13 is a schematic structural diagram corresponding to another step in the manufacturing method provided by an embodiment of the present disclosure.

As shown in FIG. 13, in step S202, all the film layers in the organic light-emitting function layers 14 are manufactured through the ink-jet printing process one by one. The ink droplets are dripped into the openings and the communicating grooves. The ink droplets are large in flowability, and thus the formed organic film layers are good in uniformity.

After the above step S202, the method may further include: a second electrode 13 is formed so as to obtain a structure as shown in FIG. 2, and the second electrode 13 is generally of a whole surface structure capable of covering the pixel defining layer and the organic light-emitting function layers.

Figure 14:
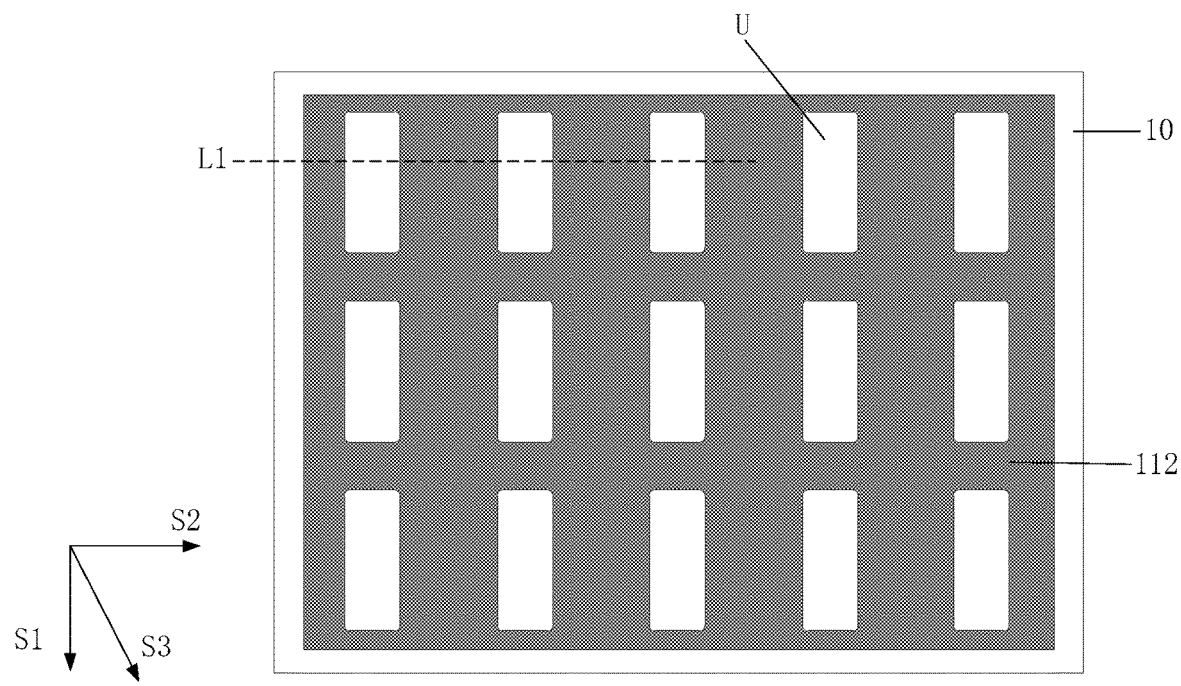
FIG. 14 is a schematic structural diagram corresponding to another step in the manufacturing method provided by an embodiment of the present disclosure.
Figure 15:
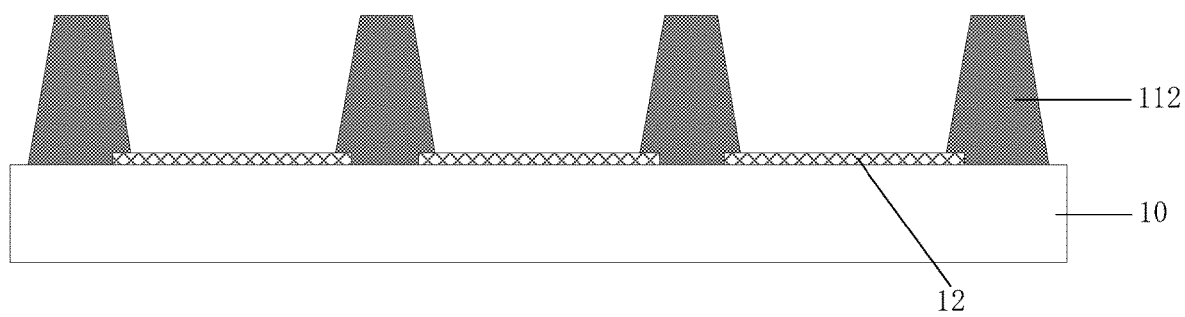
FIG. 15 is a schematic structural diagram corresponding to another step in the manufacturing method provided by an embodiment of the present disclosure.

In addition, the second pixel defining structures may also be manufactured firstly and then the first pixel defining structures are manufactured. The manufacturing order of the first pixel defining structures and the second pixel defining structures is not limited here. Specifically, the above step S201 may include:

FIG. 15 is a schematic sectional diagram of FIG. 14 at a dotted line L1. As shown in FIG. 14 and FIG. 15, a second pixel defining layer is formed on the base substrate 10 through the lyophobic material and is patterned to obtain the second pixel defining structures 112; and the first pixel defining layer is formed on the second pixel defining layer through the lyophilic material and is patterned to obtain the plurality of first pixel defining structures 112 and obtain structures as shown in FIG. 11 and FIG. 12.

Figure 16:
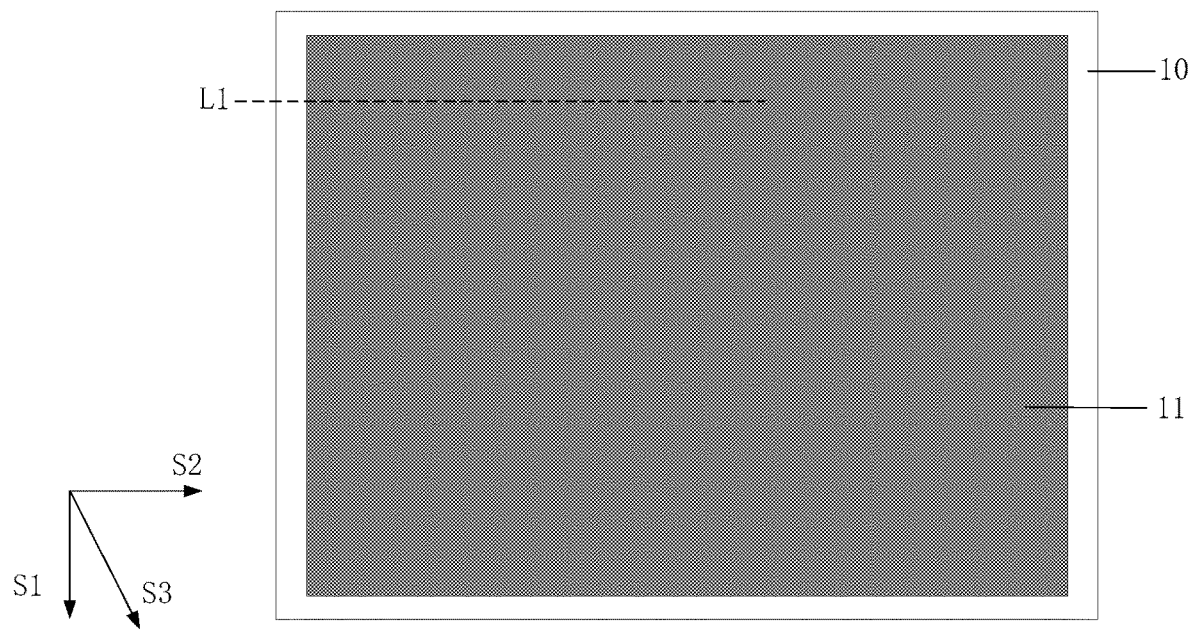
FIG. 16 is a schematic structural diagram corresponding to another step in the manufacturing method provided by an embodiment of the present disclosure.
Figure 17:
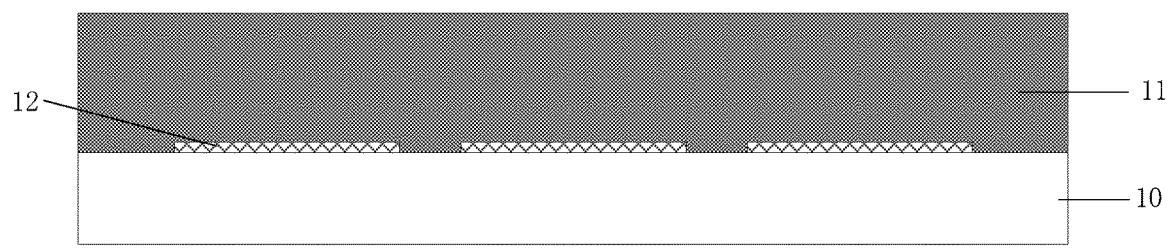
FIG. 17 is a schematic structural diagram corresponding to another step in the manufacturing method provided by an embodiment of the present disclosure.
Figure 18:
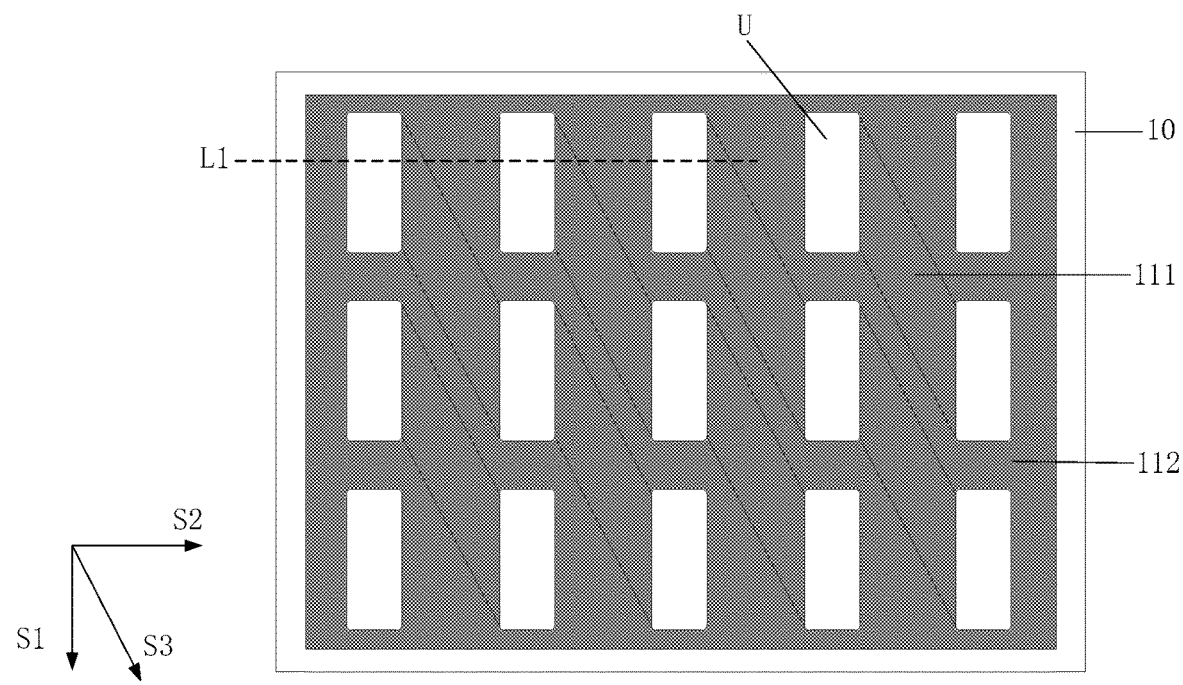
FIG. 18 is a schematic structural diagram corresponding to another step in the manufacturing method provided by an embodiment of the present disclosure.
Figure 19:
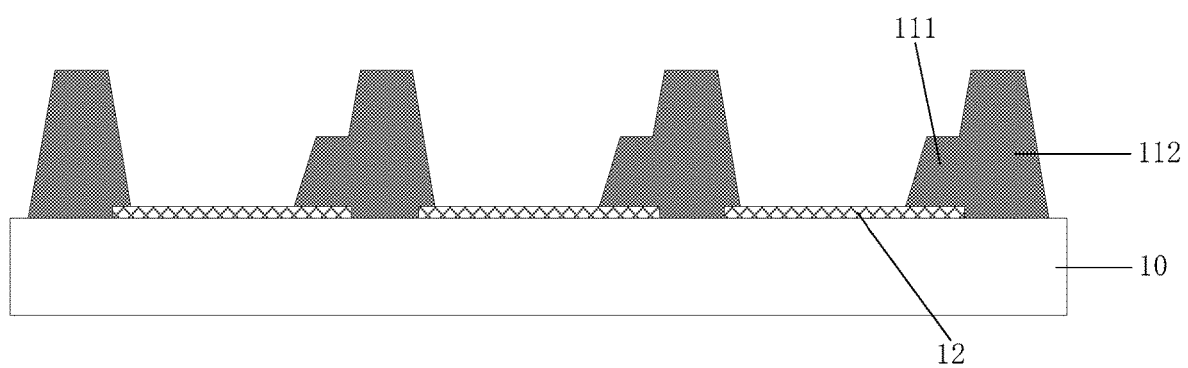
FIG. 19 is a schematic structural diagram corresponding to another step in the manufacturing method provided by an embodiment of the present disclosure.

In actual application, when the above display panel is of an integrated structure as shown in FIG. 5, the following method may be adopted for manufacturing. Taking structures as shown in FIG. 5 and FIG. 6 as an example, the above step S201 may include:

FIG. 17 is a schematic sectional diagram of FIG. 16 at a dotted line L1. As shown in FIG. 16 and FIG. 17, the pixel defining layer 11 is formed on the base substrate 10 through the lyophobic material; and the pixel defining layer 11 is patterned through a half-tone mask plate to obtain all the openings U and all the communicating grooves T with the lyophilic bottom surfaces. As shown in FIG. 18 and FIG. 19, FIG. 19 is a schematic sectional diagram of FIG. 18 at a dotted line L1.

The half-tone mask plate is adopted to pattern the pixel defining layer 11. Furthermore, the lyophobic materials are generally blended, taking the fluorinated polyimide as an example, lyophobic fluorides and lyophilic polyimide in the fluorinated polyimide are physically blended. After the fluorinated polyimide is coated on the base substrate, the fluorides have the low surface energy, therefore, in technique processes such as solvent removing and exposure, the fluorides will migrate upwards to be aggregated on the surfaces of the film layers. Therefore, after the photolithography technique is completed, the fluorides aggregated on the surfaces are removed at the positions of the communicating grooves, and the bottom surfaces of the communicating grooves T are the polyimide materials. That is to say, the performance of the bottom surfaces of the communicating grooves T is changed after the composition technique, the bottom surfaces of the communicating grooves T are made to have the lyophilic property, therefore, the openings U and all the communicating grooves T can be obtained through the one-time composition technique, the composition technique is reduced, and the manufacturing cost is saved. In addition, the above pixel defining layer may be manufactured through the positive photoresist materials such as the fluorinated polymethyl methacrylate or fluorinated polyimide so that the patterns of the pixel defining layer 11 can be obtained only by adopting the photolithography technique, thereby further reducing the process steps and reducing the manufacturing cost.

Based on the same inventive concept, an embodiment of the present disclosure further provides a display apparatus, including the above display panel. The display apparatus may be any product or component with a display function, such as a mobile phone, a tablet computer, a television, a displayer, a notebook computer, a digital photo frame and a navigator. Principles of the display apparatus for solving the problems are similar to those of the above display panel, therefore, implementation of the display apparatus may refer to that of the above display panel, which is not repeated here.

According to the above display panel, the manufacturing method thereof and the display apparatus provided by embodiments of the present disclosure, the communicating grooves are formed in the pixel defining layer to enable the openings corresponding to the two pixel units with the same color to communicate with each other, thus the flowability of the ink droplets is enhanced so as to improve the thickness uniformity of the organic thin film formed by the ink-jet printing technique, thereby improving the light emitting quality of the organic light-emitting diode.

Although the preferred embodiments of the present disclosure have been described, those skilled in the art can make additional modifications and variations on the embodiments once they know the basic creative concept. Therefore, the appended claims intend to be explained as including the preferred embodiments and all modifications and variations falling within the scope of the present disclosure.

Obviously, those skilled in the art can make various modifications and variations to the present disclosure without departing from the spirit and scope of the present disclosure. In this way, if these modifications and variations of the present disclosure fall within the scope of the claims of the present disclosure and their equivalent art, the present disclosure also intends to include these modifications and variations.

What is claimed is:

1. A display panel, comprising:
   a base substrate, wherein a plurality of pixel units are arranged on the base substrate in an array; and
   a pixel defining layer, located on the base substrate, wherein the pixel defining layer comprises: a plurality of openings and at least one communicating groove, and the plurality of openings are located in the pixel units respectively;
   wherein the plurality of pixel units are arranged in a first direction and a second direction in the array, and the first direction and the second direction are arranged perpendicular to each other; two adjacent pixel units in the first direction display different colors, and two adjacent pixel units in the second direction display different colors;

two adjacent pixel units in a third direction display same color; and the third direction is different from the first direction and the second direction; and the communicating groove is configured to connect the openings corresponding to two pixel units with same color;

wherein the display panel further comprises: an organic light-emitting function layer located in the openings;

a surface of the organic light-emitting function layer facing away from the base substrate serves as a first surface, and a surface of the pixel defining layer close to the base substrate serves as a second surface; and a distance between the first surface and the second surface is smaller than a distance between a bottom surface of the communicating groove and the second surface;

wherein the pixel defining layer comprises: a first pixel defining structure located on one side of a bottom surface of the communicating groove close to the base substrate, and a second pixel defining structure except for the first pixel defining structure; and the second pixel defining structure is of an integrated structure;

a surface of the first pixel defining structure on a side facing away from the base substrate and a surface of the second pixel defining structure on a side proximate to the base substrate are not in a same plane.

2. The display panel according to claim 1, wherein the openings are rectangular and comprise first edges extending in the first direction and second edges extending in the second direction, and a length of the first edges is larger than a length of the second edges; and the communicating groove connects two first edges close to each other in two adjacent openings.

3. The display panel according to claim 2, wherein a width of the communicating groove in the first direction is same as the length of the first edges in the first direction.

4. The display panel according to claim 1, wherein the first pixel defining structure is composed of lyophilic materials; and the second pixel defining structure is composed of lyophobic materials.

5. The display panel according to claim 4, wherein materials of the first pixel defining structure comprise silicon dioxide, silicon nitride, silicon oxynitride, polymethyl methacrylate or polyimide; and materials of the second pixel defining structure comprise fluorinated polymethyl methacrylate or fluorinated polyimide.

6. The display panel according to claim 1, wherein the pixel defining layer is of an integrated structure;

a bottom surface of the communicating groove has a lyophilic property; and a surface except for the communicating grooves, of the pixel defining layer facing away from the base substrate, has a lyophobic property.

7. The display panel according to claim 1, wherein a thickness of the pixel defining layer at a position except for the openings and the communicating groove is within a range of 0.5 µm-3 µm.

8. The display panel according to claim 1, wherein a distance between a bottom surface of the communicating groove and a surface of the pixel defining layer close to the base substrate is within a range of 0.1 µm-1 µm.

9. A method for manufacturing the display panel according to claim 1, comprising:

forming the pixel defining layer on the base substrate and patterning the pixel defining layer to form the plurality of openings and a plurality of communicating grooves; and forming an organic light-emitting function layer through an ink-jet printing technique.

10. The manufacturing method according to claim 9, wherein the forming the pixel defining layer on the base substrate and patterning the pixel defining layer to form the plurality of openings and the plurality of communicating grooves, comprises:

forming a first pixel defining layer on the base substrate through a lyophilic material and patterning the first pixel defining layer to obtain a plurality of first pixel defining structures;

forming a second pixel defining layer on the first pixel defining layer through a lyophobic material and patterning the second pixel defining layer to obtain a second pixel defining structure; or forming the second pixel defining layer on the base substrate through a lyophobic material and patterning the second pixel defining layer to obtain the second pixel defining structure; and forming the first pixel defining layer on the second pixel defining layer through the lyophilic material and patterning the first pixel defining layer to obtain the plurality of first pixel defining structures.

11. The manufacturing method according to claim 9, wherein forming the pixel defining layer on the base substrate and patterning the pixel defining layer to form the plurality of openings and the plurality of communicating grooves, comprises:

forming the pixel defining layer on the base substrate through the lyophobic material; and patterning the pixel defining layer through a half-tone mask plate to obtain the openings and the communicating grooves with lyophilic bottom surfaces.

12. A display apparatus, comprising: the display panel according to claim 1.

* * * * *